(12) United States Patent
Roohparvar et al.

(10) Patent No.: US 8,125,831 B2
(45) Date of Patent: Feb. 28, 2012

(54) SENSING AGAINST A REFERENCE CELL

(75) Inventors: Frankie F. Roohparvar, Monte Sereno, CA (US); Vishal Sarin, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/955,419

(22) Filed: Nov. 29, 2010

(65) Prior Publication Data
US 2011/0069547 A1    Mar. 24, 2011

Related U.S. Application Data

(63) Continuation of application No. 12/137,988, filed on Jun. 12, 2008, now Pat. No. 7,843,726.

(51) Int. Cl.
*G11C 16/06* (2006.01)

(52) U.S. Cl. ........... 365/185.21; 365/185.2; 365/185.03; 365/185.18; 365/185.26; 365/185.17

(58) Field of Classification Search ............. 365/185.03, 365/185.24, 185.21, 185.17, 185.2, 210.14, 365/185.14
See application file for complete search history.

(56) References Cited

U.S. PATENT DOCUMENTS
7,522,462 B2    4/2009 Edahiro et al.
(Continued)

*Primary Examiner* — Thong Q Le
(74) *Attorney, Agent, or Firm* — Leffert Jay & Polglaze, P.A.

(57) ABSTRACT

Memory devices, bulk storage devices, and methods of operating memory are disclosed, such as those adapted to process and generate analog data signals representative of data values of two or more bits of information. Programming of such memory devices can include programming to a target threshold voltage within a range representative of the desired bit pattern. Reading such memory devices can include generating an analog data signal indicative of a threshold voltage of a target memory cell. The target memory cell can be sensed against a reference cell includes a dummy string of memory cells connected to a target string of memory cells, and, such as by using a differential amplifier to sense a difference between a reference cell and the target cell. This may allow a wider range of voltages to be used for data states.

31 Claims, 6 Drawing Sheets

U.S. PATENT DOCUMENTS

2006/0239073 A1 10/2006 Toda
2007/0147112 A1 6/2007 Edahiro et al.
2008/0062762 A1* 3/2008 Doyle .................... 365/185.11
2009/0296471 A1 12/2009 Goda et al.

* cited by examiner

SENSING AGAINST A REFERENCE CELL

RELATED APPLICATION

This application is a continuation of U.S. application Ser. No. 12/137,988, titled "SENSING AGAINST A REFERENCE CELL," filed Jun. 12, 2008, now U.S. Pat. No. 7,843,726, issued Nov. 30, 2010, which is commonly assigned and incorporated herein by reference.

FIELD

The present disclosure relates generally to semiconductor memory, and in particular, the present disclosure relates to solid state non-volatile memory devices and systems utilizing analog signals to communicate data values of two or more bits of information.

BACKGROUND

Electronic devices commonly have some type of bulk storage device available to them. A common example is a hard disk drive (HDD). HDDs are capable of large amounts of storage at relatively low cost, with current consumer HDDs available with over one terabyte of capacity.

HDDs generally store data on rotating magnetic media or platters. Data is typically stored as a pattern of magnetic flux reversals on the platters. To write data to a typical HDD, the platter is rotated at high speed while a write head floating above the platter generates a series of magnetic pulses to align magnetic particles on the platter to represent the data. To read data from a typical HDD, resistance changes are induced in a magnetoresistive read head as it floats above the platter rotated at high speed. In practice, the resulting data signal is an analog signal whose peaks and valleys are the result of the magnetic flux reversals of the data pattern. Digital signal processing techniques called partial response maximum likelihood (PRML) are then used to sample the analog data signal to determine the likely data pattern responsible for generating the data signal.

HDDs have certain drawbacks due to their mechanical nature. HDDs are susceptible to damage or excessive read/write errors due to shock, vibration or strong magnetic fields. In addition, they are relatively large users of power in portable electronic devices.

Another example of a bulk storage device is a solid state drive (SSD). Instead of storing data on rotating media, SSDs utilize semiconductor memory devices to store their data, but include an interface and form factor making them appear to their host system as if they are a typical HDD. The memory devices of SSDs are typically non-volatile flash memory devices.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

Unlike HDDs, the operation of SSDs is generally not subject to vibration, shock or magnetic field concerns due to their solid state nature. Similarly, without moving parts, SSDs have lower power requirements than HDDs. However, SSDs currently have much lower storage capacities compared to HDDs of the same form factor and a significantly higher cost per bit.

For the reasons stated above, and for other reasons which will become apparent to those skilled in the art upon reading and understanding the present specification, there is a need in the art for alternative bulk storage options.

DETAILED DESCRIPTION

Figure 1:
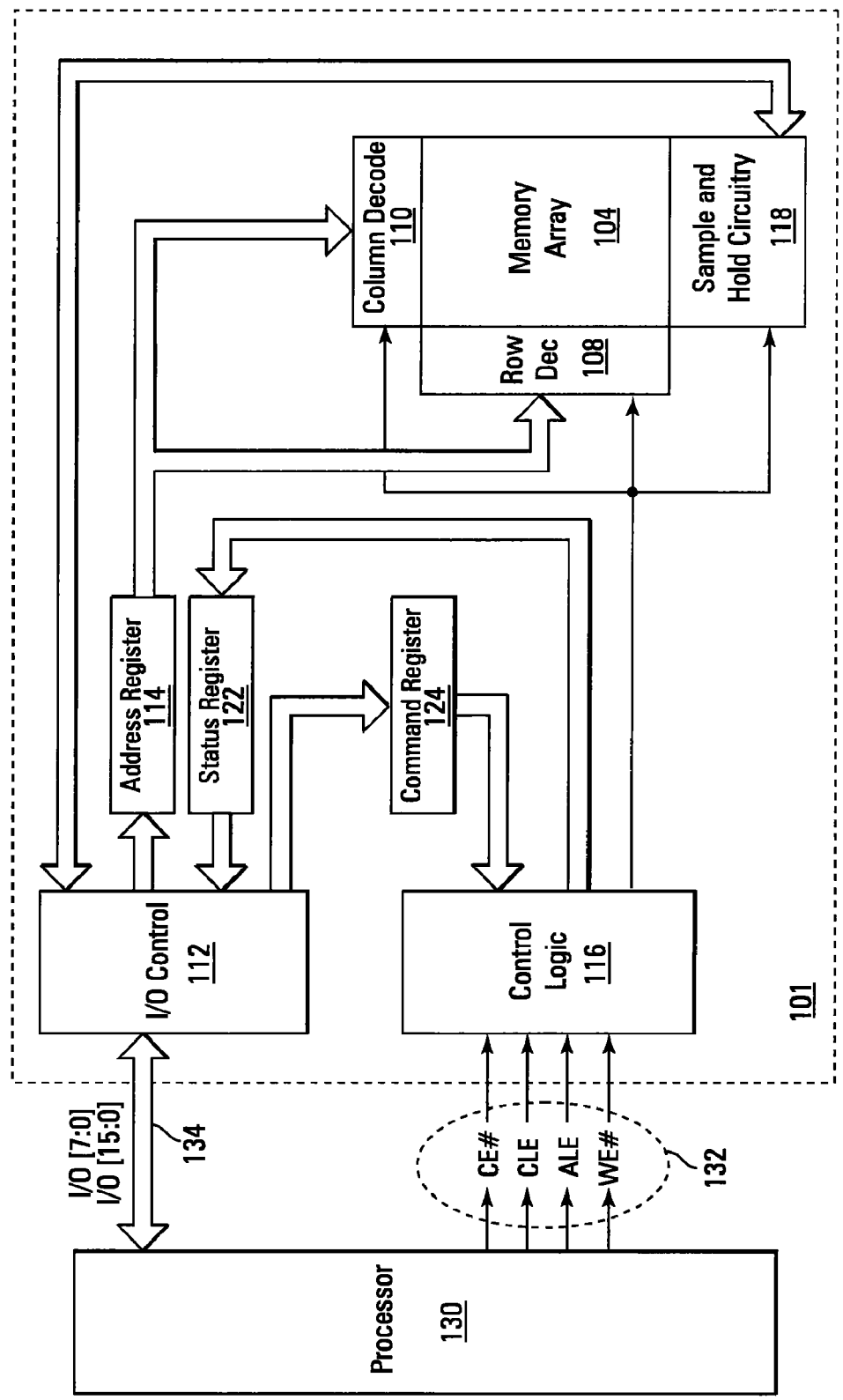
FIG. 1 is a simplified block diagram of a memory device according to an embodiment of the disclosure.

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Traditional solid-state memory devices pass data in the form of binary signals. Typically, a ground potential represents a first logic level of a bit of data, e.g., a '0' data value, while a supply potential represents a second logic level of a bit of data, e.g., a '1' data value. A multi-level cell (MLC) may be assigned, for example, four different threshold voltage (Vt) ranges of 200 mV for each range, with each range corresponding to a distinct data state, thereby representing four data values or bit patterns. Typically, a dead space or margin of 0.2V to 0.4V is between each range to keep the Vt distributions from overlapping. If the Vt of the cell is within the first range, the cell may be deemed to store a logical 11 state and is typically considered the erased state of the cell. If the Vt is within the second range, the cell may be deemed to store a logical 10 state. If the Vt is within the third range, the cell may be deemed to store a logical 00 state. And if the Vt is within the fourth range, the cell may be deemed to store a logical 01 state.

When programming a traditional MLC device as described above, cells are generally first erased, as a block, to correspond to the erased state. Following erasure of a block of cells, the least-significant bit (LSB) of each cell is first programmed, if necessary. For example, if the LSB is a 1, then no programming is necessary, but if the LSB is a 0, then the Vt of the target memory cell is moved from the Vt range corresponding to the 11 logic state to the Vt range corresponding to the 10 logic state. Following programming of the LSBs, the most-significant bit (MSB) of each cell is programmed in a similar manner, shifting the Vt where necessary. When reading an MLC of a traditional memory device, one or more read operations determine generally into which of the ranges the Vt of the cell voltage falls. For example, a first read operation may determine whether the Vt of the target memory cell is indicative of the MSB being a 1 or a 0 while a second read operation may determine whether the Vt of the target memory cell in indicative of the LSB being a 1 or a 0. In each case, however, a single bit is returned from a read operation of a target memory cell, regardless of how many bits are stored on each cell. This problem of multiple program and read operations becomes increasingly troublesome as more bits are stored on each MLC. Because each such program or read operation is a binary operation, i.e., each programs or returns a single bit of information per cell, storing more bits on each MLC leads to longer operation times.

The memory devices of an illustrative embodiment store data as Vt ranges on the memory cells. In contrast to traditional memory devices, however, program and read operations are capable of utilizing data signals not as discrete bits of MLC data values, but as full representations of MLC data values, such as their complete bit patterns. For example, in a two-bit MLC device, instead of programming a cell's LSB and subsequently programming that cell's MSB, a target threshold voltage may be programmed representing the bit pattern of those two bits. That is, a series of program and verify operations would be applied to a memory cell until that memory cell obtained its target threshold voltage rather than programming to a first threshold voltage for a first bit, shifting to a second threshold voltage for a second bit, etc. Similarly, instead of utilizing multiple read operations to determine each bit stored on a cell, the threshold voltage of the cell may be determined and passed as a single signal representing the complete data value or bit pattern of the cell. The memory devices of the various embodiments do not merely look to whether a memory cell has a threshold voltage above or below some nominal threshold voltage as is done in traditional memory devices. Instead, a voltage signal is generated that is representative of the actual threshold voltage of that memory cell across the continuum of possible threshold voltages. An advantage of this approach becomes more significant as the bits per cell count is increased. For example, if the memory cell were to store eight bits of information, a single read operation would return a single analog data signal representative of eight bits of information.

FIG. 1 is a simplified block diagram of a memory device 101 according to an embodiment of the disclosure. Memory device 101 includes an array of memory cells 104 arranged in rows and columns. Although the various embodiments will be described primarily with reference to NAND memory arrays, the various embodiments are not limited to a specific architecture of the memory array 104. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 108 and a column decode circuitry 110 are provided to decode address signals provided to the memory device 101. Address signals are received and decoded to access memory array 104. Memory device 101 also includes input/output (I/O) control circuitry 112 to manage input of commands, addresses and data to the memory device 101 as well as output of data and status information from the memory device 101. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses.

Control logic 116 is also coupled to a sample and hold circuitry 118. The sample and hold circuitry 118 latches data, either incoming or outgoing, in the form of analog voltage levels. For example, the sample and hold circuitry could contain capacitors or other analog storage devices for sampling either an incoming voltage signal representing data to be written to a memory cell or an outgoing voltage signal indicative of the threshold voltage sensed from a memory cell. The sample and hold circuitry 118 may further provide for amplification and/or buffering of the sampled voltage to provide a stronger data signal to an external device.

The handling of analog voltage signals may take an approach similar to an approach well known in the area of CMOS imager technology, where charge levels generated at pixels of the imager in response to incident illumination are stored on capacitors. These charge levels are then converted to voltage signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a voltage level indicative of an actual or target threshold voltage of a memory cell for reading or programming, respectively, the memory cell. This charge could then be converted to an analog voltage using a differential amplifier having a grounded input or other reference signal as a second input. The output of the differential amplifier could then be passed to the I/O control circuitry 112 for output from the memory device, in the case of a read operation, or used for comparison during one or more verify operations in programming the memory device. It is noted that the I/O control circuitry 112 could optionally include analog-to-digital conversion functionality and digital-to-analog conversion (DAC) functionality to convert read data from an analog signal to a digital bit pattern and to convert write data from a digital bit pattern to an analog signal such that the memory device 101 could be adapted for communication with either an analog or digital data interface.

During a write operation, target memory cells of the memory array 104 are programmed until voltages indicative of their Vt levels match the levels held in the sample and hold circuitry 118. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the Vt levels of the target memory cells are passed to the sample and hold circuitry 118 for transfer to an external processor (not shown in FIG. 1) either directly as analog signals or as digitized representations of the analog signals depending upon whether ADC/DAC functionality is provided external to, or within, the memory device.

Threshold voltages of cells may be determined in a variety of manners. For example, a word line voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 118 may include caching, i.e., multiple storage locations for each data value, such that the memory device 101 may be reading a next data value while passing a first data value to the external processor, or receiving a next data value while writing a first data value to the memory array 104. A status register 122 is coupled between I/O control circuitry 112 and control logic 116 to latch the status information for output to the external processor.

Memory device 101 receives control signals at control logic 116 over a control link 132. The control signals may include a chip enable CE#, a command latch enable CLE, an address latch enable ALE, and a write enable WE#. Memory device 101 may receive commands (in the form of command signals), addresses (in the form of address signals), and data (in the form of data signals) from an external processor over a multiplexed input/output (I/O) bus 134 and output data to the external processor over I/O bus 134.

In a specific example, commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data may be received over input/output (I/O) pins [7:0] for a device capable of receiving eight parallel signals, or input/output (I/O) pins [15:0] for a device capable of receiving sixteen parallel signals, at I/O control circuitry 112 and are transferred to sample and hold circuitry 118. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 1 has been simplified to help focus on the embodiments of the disclosure. Additionally, while the memory device of FIG. 1 has been described in accordance with popular conventions for receipt and output of the various signals, it is noted that the various embodiments are not limited by the specific signals and I/O configurations described unless expressly noted herein. For example, command and address signals could be received at inputs separate from those receiving the data signals, or data signals could be transmitted serially over a single I/O line of I/O bus 134. Because the data signals represent bit patterns instead of individual bits, serial communication of an 8-bit data signal could be as efficient as parallel communication of eight signals representing individual bits.

Figure 2:
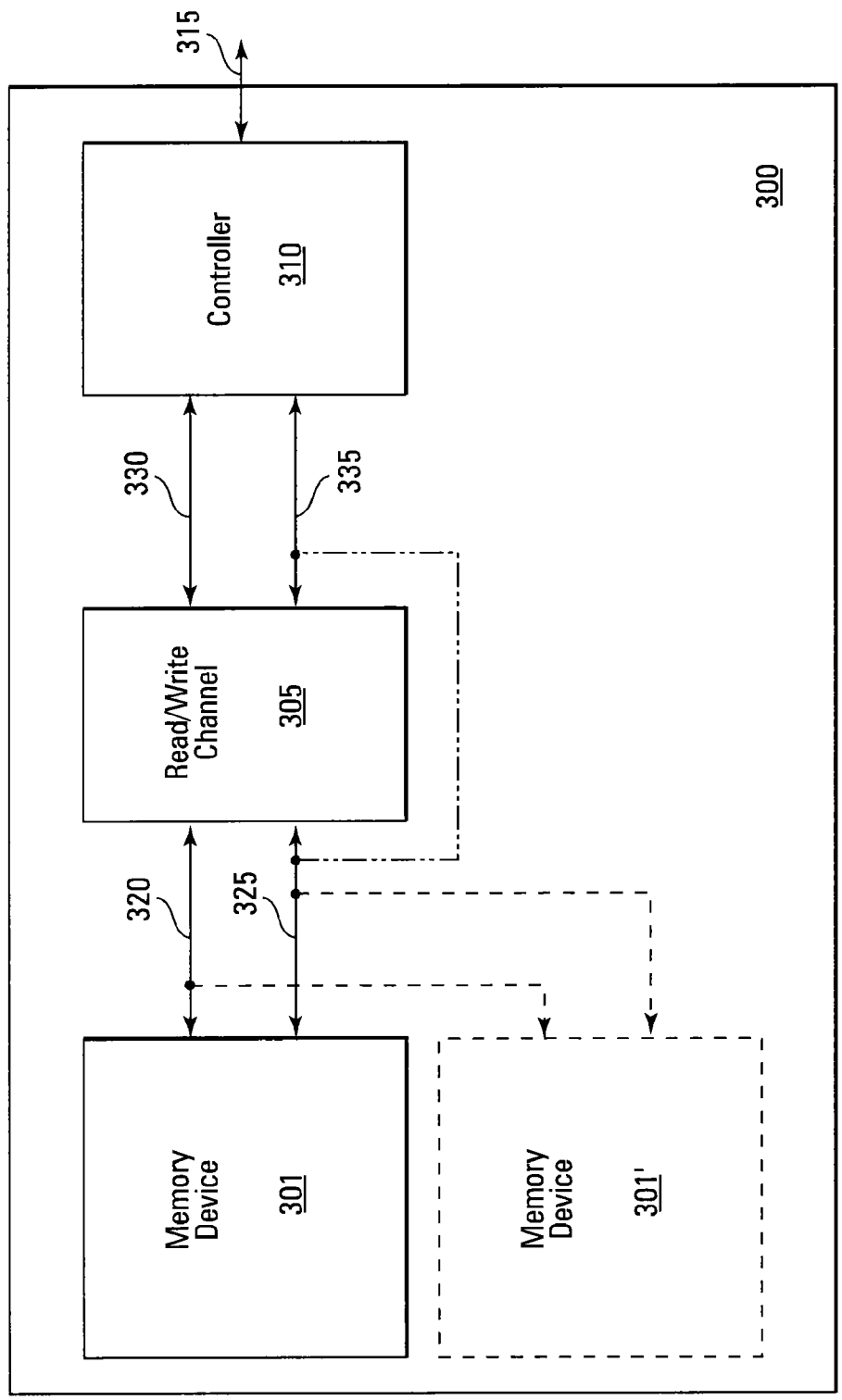
FIG. 2 is a block schematic of a solid state bulk storage device in accordance with one embodiment of the present disclosure.

Memory devices of the various embodiments may be advantageously used in bulk storage devices. For various embodiments, these bulk storage devices may take on the same form factor and communication bus interface of traditional HDDs, thus allowing them to replace such drives in a variety of applications. Some common form factors for HDDs include the 3.5", 2.5" and PCMCIA (Personal Computer Memory Card International Association) form factors commonly used with current personal computers and larger digital media recorders, as well as 1.8" and 1" form factors commonly used in smaller personal appliances, such as mobile telephones, personal digital assistants (PDAs) and digital media players. Some common bus interfaces include universal serial bus (USB), AT attachment interface (ATA) [also known as integrated drive electronics or IDE], serial ATA (SATA), small computer systems interface (SCSI) and the Institute of Electrical and Electronics Engineers (IEEE) 1394 standard. While a variety of form factors and communication interfaces were listed, the embodiments are not limited to a specific form factor or communication standard. Furthermore, the embodiments need not conform to a HDD form factor or communication interface. FIG. 2 is a block schematic of a solid state bulk storage device 300 in accordance with one embodiment of the present disclosure.

The bulk storage device 300 includes a memory device 301 in accordance with an embodiment of the disclosure, a read/write channel 305 and a controller 310. The read/write channel 305 provides for analog-to-digital conversion of data signals received from the memory device 301 as well as digital-to-analog conversion of data signals received from the controller 310. The controller 310 provides for communication between the bulk storage device 300 and an external processor (not shown in FIG. 2) through bus interface 315. It is noted that the read/write channel 305 could service one or more additional memory devices, as depicted by memory device 301' in dashed lines. Selection of a single memory device 301 for communication can be handled through a multi-bit chip enable signal or other multiplexing scheme.

The memory device 301 is coupled to a read/write channel 305 through an analog interface 320 and a digital interface 325. The analog interface 320 provides for the passage of analog data signals between the memory device 301 and the read/write channel 305 while the digital interface 325 provides for the passage of control signals, command signals and address signals from the read/write channel 305 to the memory device 301. The digital interface 325 may further provide for the passage of status signals from the memory device 301 to the read/write channel 305. The analog interface 320 and the digital interface 325 may share signal lines as noted with respect to the memory device 101 of FIG. 1. Although the embodiment of FIG. 2 depicts a dual analog/digital interface to the memory device, functionality of the read/write channel 305 could optionally be incorporated into the memory device 301 as discussed with respect to FIG. 1 such that the memory device 301 communicates directly with the controller 310 using only a digital interface for passage of control signals, command signals, status signals, address signals and data signals.

The read/write channel 305 is coupled to the controller 310 through one or more interfaces, such as a data interface 330 and a control interface 335. The data interface 330 provides for the passage of digital data signals between the read/write channel 305 and the controller 310. The control interface 335 provides for the passage of control signals, command signals and address signals from the controller 310 to the read/write channel 305. The control interface 335 may further provide for the passage of status signals from the read/write channel 305 to the controller 310. Status and command/control signals may also be passed directly between the controller 310 and the memory device 301 as depicted by the dashed line connecting the control interface 335 to the digital interface 325.

Although depicted as two distinct devices in FIG. 2, the functionality of the read/write channel 305 and the controller 310 could alternatively be performed by a single integrated circuit device. And while maintaining the memory device 301 as a separate device would provide more flexibility in adapting the embodiments to different form factors and communication interfaces, because it is also an integrated circuit device, the entire bulk storage device 300 could be fabricated as a single integrated circuit device.

The read/write channel 305 is a signal processor adapted to at least provide for conversion of a digital data stream to an analog data stream and vice versa. A digital data stream provides data signals in the form of binary voltage levels, i.e., a first voltage level indicative of a bit having a first binary data value, e.g., 0, and a second voltage level indicative of a bit having a second binary data value, e.g., 1. An analog data stream provides data signals in the form of analog voltages having more than two levels, with different voltage levels or ranges corresponding to different bit patterns of two or more bits. For example, in a system adapted to store two bits per memory cell, a first voltage level or range of voltage levels of an analog data stream could correspond to a bit pattern of 11, a second voltage level or range of voltage levels of an analog data stream could correspond to a bit pattern of 10, a third voltage level or range of voltage levels of an analog data stream could correspond to a bit pattern of 00 and a fourth voltage level or range of voltage levels of an analog data stream could correspond to a bit pattern of 01. Thus, one analog data signal in accordance with the various embodiments would be converted to two or more digital data signals, and vice versa.

In practice, control and command signals are received at the bus interface 315 for access of the memory device 301 through the controller 310. Addresses and data values may also be received at the bus interface 315 depending upon what type of access is desired, e.g., write, read, format, etc. In a shared bus system, the bus interface 315 would be coupled to a bus along with a variety of other devices. To direct communications to a specific device, an identification value may be placed on the bus indicating which device on the bus is to act upon a subsequent command. If the identification value matches the value taken on by the bulk storage device 300, the controller 310 would then accept the subsequent command at the bus interface 315. If the identification value did not match, the controller 310 would ignore the subsequent communication. Similarly, to avoid collisions on the bus, the various devices on a shared bus may instruct other devices to cease outbound communication while they individually take control of the bus. Protocols for bus sharing and collision avoidance are well known and will not be detailed herein. The controller 310 then passes the command, address and data signals on to the read/write channel 305 for processing. Note that the command, address and data signals passed from the controller 310 to the read/write channel 305 need not be the same signals received at the bus interface 315. For example, the communication standard for the bus interface 315 may differ from the communication standard of the read/write channel 305 or the memory device 301. In this situation, the controller 310 may translate the commands and/or addressing scheme prior to accessing the memory device 301. In addition, the controller 310 may provide for load leveling within the one or more memory devices 301, such that physical addresses of the memory devices 301 may change over time for a given logical address. Thus, the controller 310 would map the logical address from the external device to a physical address of a target memory device 301.

For write requests, in addition to the command and address signals, the controller 310 would pass digital data signals to the read/write channel 305. For example, for a 16-bit data word, the controller 310 would pass 16 individual signals having a first or second binary logic level. The read/write channel 305 would then convert the digital data signals to an analog data signal representative of the bit pattern of the digital data signals. To continue with the foregoing example, the read/write channel 305 would use a digital-to-analog conversion to convert the 16 individual digital data signals to a single analog signal having a potential level indicative of the desired 16-bit data pattern. For one embodiment, the analog data signal representative of the bit pattern of the digital data signals is indicative of a desired threshold voltage of the target memory cell. However, in programming of a one-transistor memory cells, it is often the case that programming of neighboring memory cells will increase the threshold voltage of previously programmed memory cells. Thus, for another embodiment, the read/write channel 305 can take into account these types of expected changes in the threshold voltage, and adjust the analog data signal to be indicative of a threshold voltage lower than the final desired threshold voltage. After conversion of the digital data signals from the controller 310, the read/write channel 305 would then pass the write command and address signals to the memory device 301 along with the analog data signals for use in programming the individual memory cells. Programming can occur on a cell-by-cell basis, but is generally performed for a page of data per operation. For a typical memory array architecture, a page of data includes every other memory cell coupled to a word line.

For read requests, the controller would pass command and address signals to the read/write channel 305. The read/write channel 305 would pass the read command and address signals to the memory device 301. In response, after performing the read operation, the memory device 301 would return the analog data signals indicative of the threshold voltages of the memory cells defined by the address signals and the read command. The memory device 301 may transfer its analog data signals in parallel or serial fashion.

The analog data signals may also be transferred not as discrete voltage pulses, but as a substantially continuous stream of analog signals. In this situation, the read/write channel 305 may employ signal processing similar to that used in HDD accessing called PRML or partial response, maximum likelihood. In PRML processing of a traditional HDD, the read head of the HDD outputs a stream of analog signals representative of flux reversals encountered during a read operation of the HDD platter. Rather than attempting to capture the true peaks and valleys of this analog signal generated in response to flux reversals encountered by the read head, the signal is periodically sampled to create a digital representation of the signal pattern. This digital representation can then be analyzed to determine the likely pattern of flux reversals responsible for generation of the analog signal pattern. This same type of processing can be utilized with embodiments of the present disclosure. By sampling the analog signal from the memory device 301, PRML processing can be employed to determine the likely pattern of threshold voltages responsible for generation of the analog signal.

Figure 3:
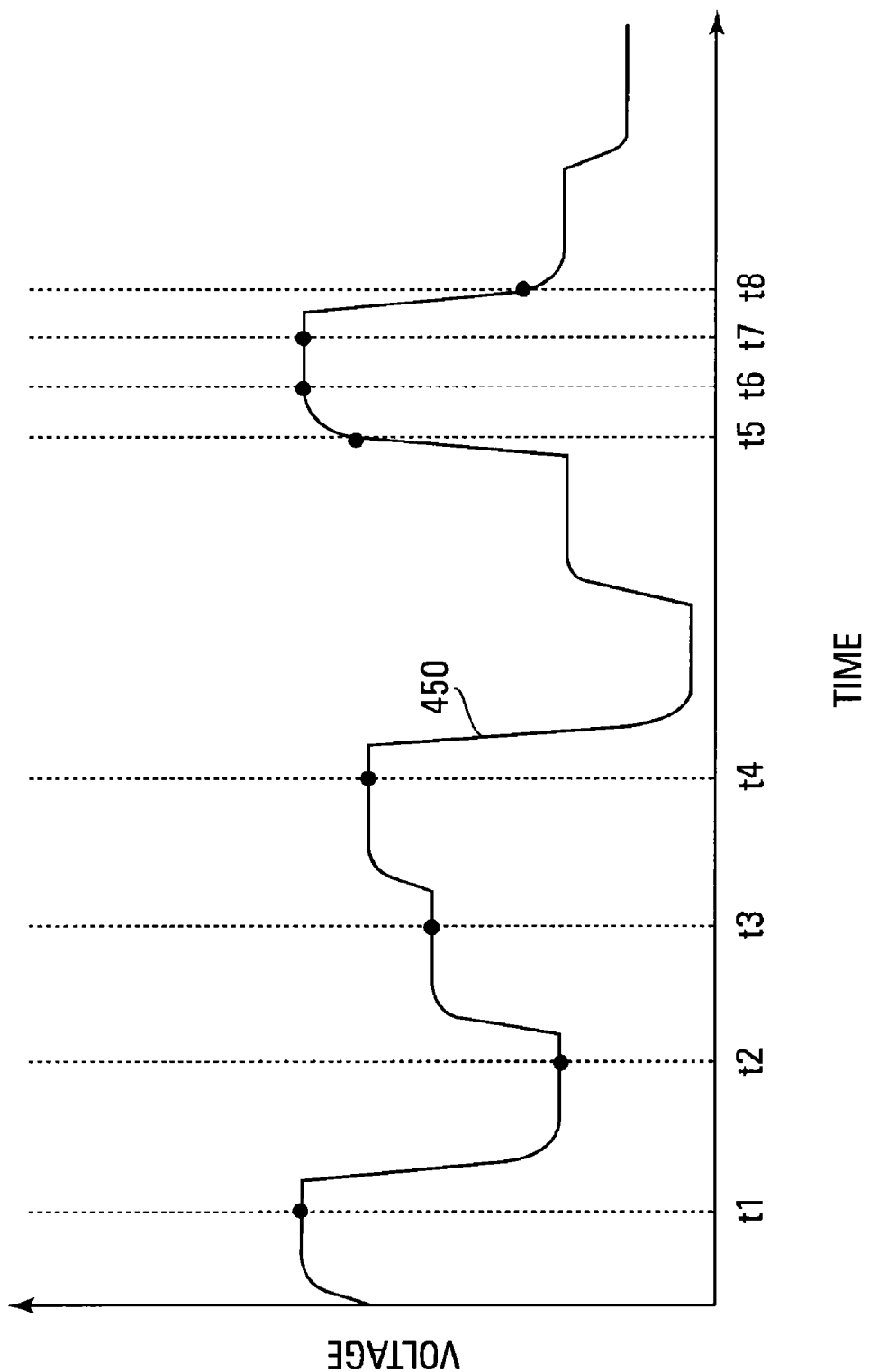
FIG. 3 is a depiction of a wave form showing conceptually a data signal as might be received from the memory device by a read/write channel in accordance with an embodiment of the disclosure.

FIG. 3 is a depiction of a wave form showing conceptually a data signal 450 as might be received from the memory device 301 by the read/write channel 305 in accordance with an embodiment of the disclosure. The data signal 450 could be periodically sampled and a digital representation of the data signal 450 can be created from the amplitudes of the sampled voltage levels. For one embodiment, the sampling could be synchronized to the data output such that sampling occurs during the steady-state portions of the data signal 450. Such an embodiment is depicted by the sampling as indicated by the dashed lines at times t1, t2, t3 and t4. However, if synchronized sampling becomes misaligned, values of the data samples may be significantly different than the steady-state values. In an alternate embodiment, sampling rates could be increased to allow determination of where steady-state values likely occurred, such as by observing slope changes indicated by the data samples. Such an embodiment is depicted by the sampling as indicated by the dashed lines at times t5, t6, t7 and t8, where a slope between data samples at times t6 and t7 may indicate a steady-state condition. In such an embodiment, a trade-off is made between sampling rate and accuracy of the representation. Higher sampling rates lead to more accurate representations, but also increase processing time. Regardless of whether sampling is synchronized to the data output or more frequent sampling is used, the digital representation can then be used to predict what incoming voltage levels were likely responsible for generating the analog signal pattern. In turn, the likely data values of the individual memory cells being read can be predicted from this expected pattern of incoming voltage levels.

Recognizing that errors will occur in the reading of data values from the memory device 301, the read/write channel 305 may include error correction. Error correction is commonly used in memory devices, as well as HDDs, to recover from expected errors. Typically, a memory device will store user data in a first set of locations and error correction code (ECC) in a second set of locations. During a read operation, both the user data and the ECC are read in response to a read request of the user data. Using known algorithms, the user data returned from the read operation is compared to the ECC. If the errors are within the limits of the ECC, the errors will be corrected.

Figure 4:
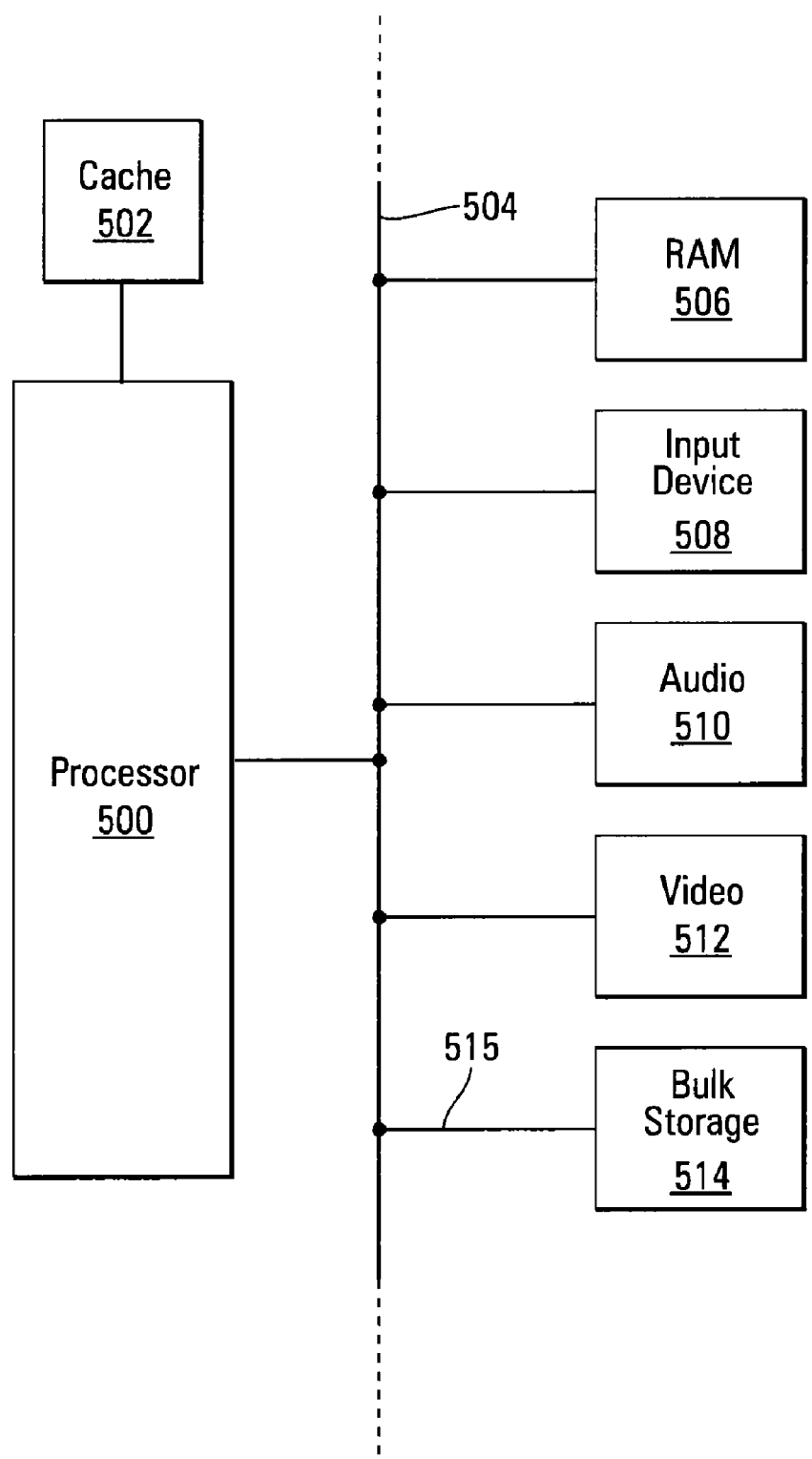
FIG. 4 is a block schematic of an electronic system in accordance with an embodiment of the disclosure.

FIG. 4 is a block schematic of an electronic system in accordance with an embodiment of the disclosure. Example electronic systems may include personal computers, PDAs, digital cameras, digital media players, digital recorders, electronic games, appliances, vehicles, wireless devices, mobile telephones and the like.

The electronic system includes a host processor 500 that may include cache memory 502 to increase the efficiency of the processor 500. The processor 500 is coupled to a communication bus 504. A variety of other devices may be coupled to the communication bus 504 under control of the processor 500. For example, the electronic system may include random access memory (RAM) 506; one or more input devices 508 such as keyboards, touch pads, pointing devices, etc.; an audio controller 510; a video controller 512; and one or more bulk storage devices 514. At least one bulk storage device 514 includes a digital bus interface 515 for communication with the bus 504, one or more memory devices in accordance with an embodiment of the disclosure having an analog interface for transfer of data signals representative of data patterns of two or more bits of data, and a signal processor adapted to perform digital-to-analog conversion of digital data signals received from the bus interface 515 and analog-to-digital conversion of analog data signals received from its memory device(s).

Sensing Against a Reference Cell

Temperature and process variations in memories can lead to different cells having different characteristics. Cells behave differently as temperature changes. Also, variations in process can also result in variations in cell operation and voltages stored on the device. Typically, a voltage stored on a memory cell is an absolute voltage. In a typical configuration, any absolute voltage between 0 volts and −3 volts is the same for purposes of storing and reading. That is, any voltage within that range corresponds to just one data state. There is only one state in the voltage range from 0 volts to −3 volts when using absolute voltage readings. Various embodiments described herein provide for a differential reading instead of reading an absolute voltage, allowing temperature and process variations to be mitigated, and opening up the 0 volts to −3 volts range to be usable for more than one data state.

In one embodiment, a reference cell and target cell coupled with a PMOS current mirror load and a bias current source make up a differential amplifier. The reference and target cells are part of this differential amplifier. The embodiments of the present invention allow sensing of a difference between the target memory cell and the reference cell. Sensing the difference between the threshold voltages of the target memory cell and the reference cell mitigates temperature and process variations and effects as both the target memory cell and the reference cell move in similar manners in response to temperature variations. Also, sensing a threshold voltage difference between the target memory cell and the reference cell allows usage of an entire voltage window range for sensing. In a voltage range of, for example, −3 volts to 3.5 volts, the range of −3 volts to 0 volts typically corresponds to one data state as a ground potential on the word line will activate the cell regardless of where in the range its actual threshold voltage falls. However, in using a threshold voltage difference between the target memory cell and the reference cell, sub-ranges within the negative voltage portion of the threshold voltage range can correspond to additional data states.

Figure 5:
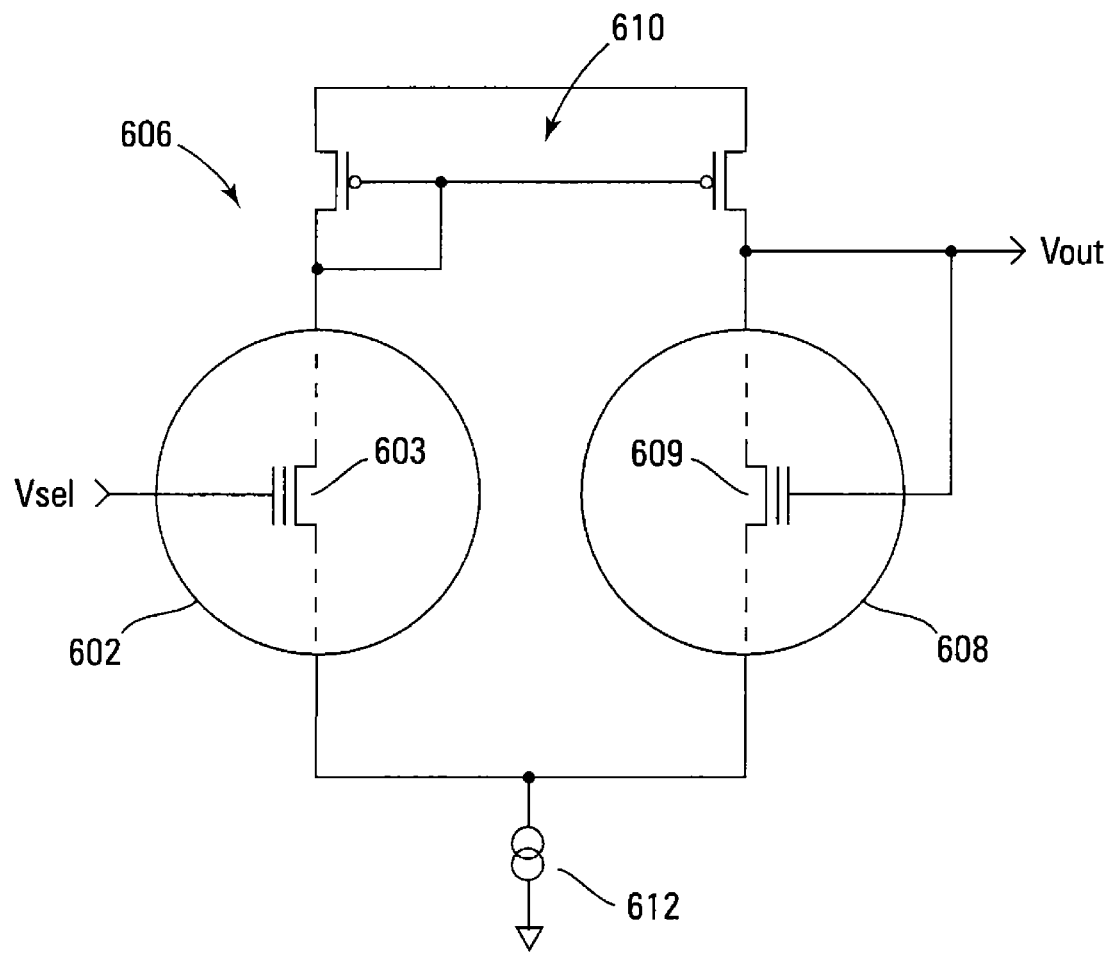
FIG. 5 is a circuit diagram of a differential amplifier in accordance with another embodiment of the present invention.

Further, the target cells and the reference cells are in one embodiment formed at substantially the same time, and in another embodiment are formed using substantially the same process. This makes the target cells and the reference cells substantially similar in construction. A circuit according to one embodiment is shown in FIG. 5, and includes a differential amplifier 606 having a set of PMOS transistors 610, a reference string 608 with a selected reference cell 609, a selected string 602 with a selected target cell 603, and a bias current source 612. As described above, the reference cell 609 and target cell 603 are coupled with PMOS current mirror load 610 and a bias current source 612 to make up the differential amplifier 606.

For illustration purposes, the details of the reference string 608 are not shown. Instead, a single reference cell 609 is shown. In one embodiment, the reference string is a string of cells, such as NAND cells. In another embodiment, the reference string has a single cell. It should be understood that other permutations and variations of reference strings, including by way of example only and not by way of limitation AND strings and other architectures, are amenable to use with the embodiments described herein without departing from the scope of the embodiments.

Figure 6:
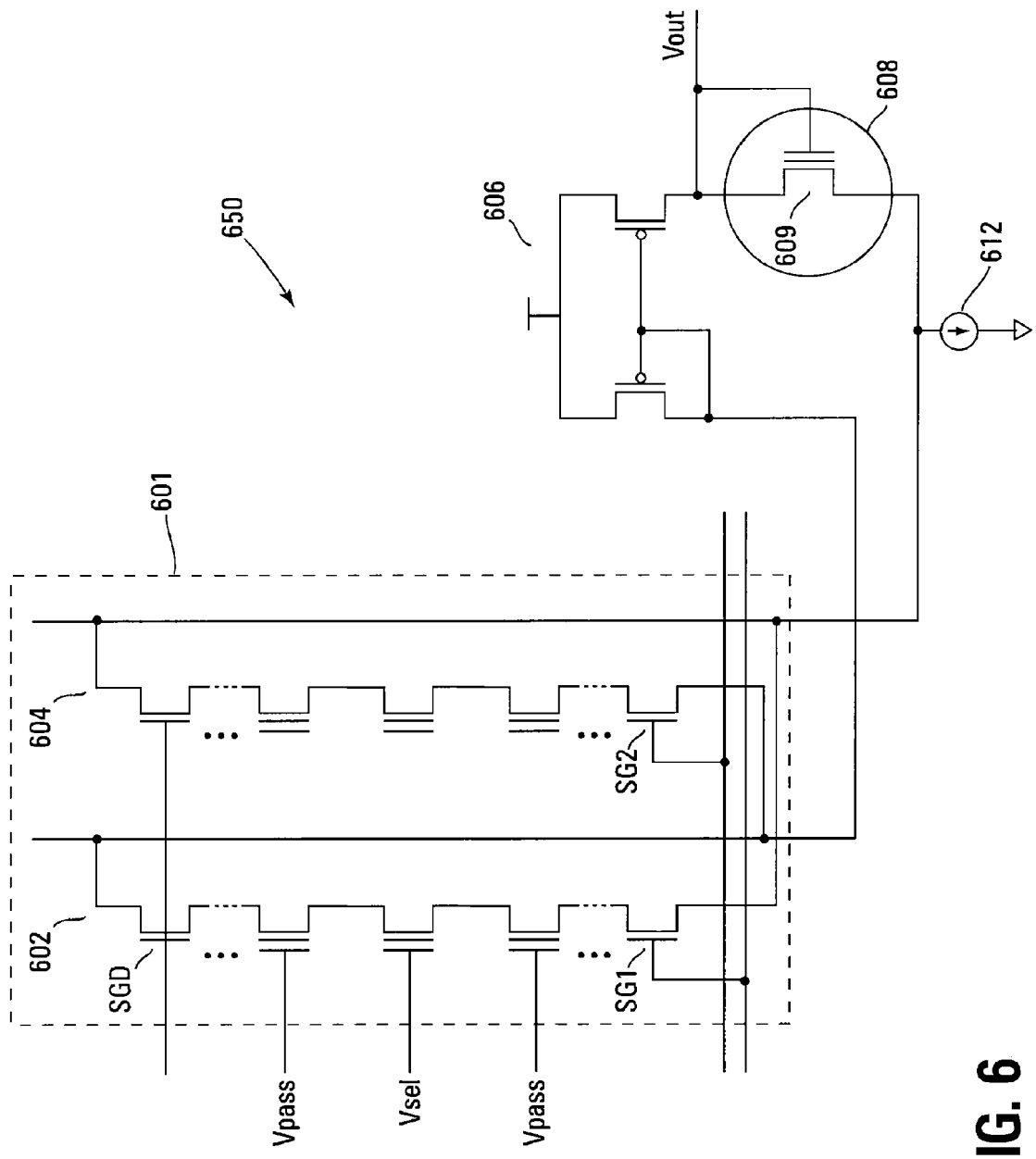
FIG. 6 is a circuit diagram of a differential amplifier in conjunction with a memory array according to another embodiment of the present invention.

In operation, differential amplifier 606 has a string of memory cells 602 including selected cell 603, a string of reference memory cells 608 including memory cell 609 is connected to a string of target cells as is shown in FIG. 6. The cell 609, which may be one in the string of reference cells 608, is programmed to a known voltage. By programming the cell 609 to a known voltage, the threshold voltage difference between the cell 609 and a target cell can be determined using the differential amplifier 606. The various embodiments of differential sensing allow for an output voltage differential from 0 to 6.5 volts, rendering the entire actual voltage range from −3 to 3.5 volts usable for data states. For example, the reference cell 609 can be programmed to a Vt of −3V and Vsel (applied to the gate of the target cell 603) can be biased at 6.5V. When the Vt of selected cell 603 is −3V, the output of the differential amplifier 606 is ideally 6.5V. When the Vt of selected cell 603 is 3.5V, the output is 0V. Thus for a selected cell 603 Vt of −3 to 3.5V, the output of the differential amplifier 606 covers the entire Vt window of 6.5V to 0V.

The target cells store data as has been described. The reference cells store a voltage that is known when it is programmed, and can be used to determine potential failures due to cycling and charge loss, and the like. Sensing a difference between two cells should remove the effects of process variations such as differences due to temperature variations, for example. Strings of reference cells and strings of target cells form part of the differential amplifier, and a difference between selected target and reference cells is obtained using the differential amplifier. Typically, a negative voltage, such as that in a range from 0 volts to −3 volts, represents a single data state (a ground potential on the word line activates the cell regardless of where in the range the negative voltage actually is). However, looking at a difference between a target cell and a reference cell makes the entire range available, since it is a difference and not an absolute voltage which is the concern when sensing a difference.

FIG. 6 shows another embodiment 650 including a differential amplifier 606 (such as described above), in conjunction with a memory array 601 having two strings 602 and 604 of memory cells. When string 602 is a selected string for a memory operation, the cell of string 602 that is selected, cell 603 as shown, has a select voltage Vsel applied to its gate, while other cells in the string have a pass voltage Vpass applied to their gates. Vpass is sufficient to turn the devices on. To select string 602, transistors SGD and SG1 are turned on. This places string 602 into the differential amplifier 606 as is shown also in FIG. 5. In the reference string 608, dummy reference cell 609 is coupled to node Vout, while the remaining cells of string 5608 are coupled to pass voltage Vpass. To select string 604 as the selected string, transistors SGD and SG2 are turned on.

If the reference string is a string of reference cells, in one embodiment the dummy reference cell 609 coupled to Vout is in the same position in the reference string 608 as the selected cell 603 of the selected string 602. In other embodiments, a single reference cell is used, or a cell in a different position in the string 608 is used. As long as the reference string or cell varies with temperature the same way the selected string varies, performance of the differential circuit will be acceptable. A string of reference cells is used in one embodiment since the string of reference cells varies more accurately with temperature than a single reference cell.

The various embodiments include circuits and methods for sensing against a reference cell, that is, sensing a threshold voltage difference between a reference memory cell and a target memory cell. This is facilitated by connecting a target memory cell and a reference memory cell to a differential amplifier, and sensing a threshold voltage difference between the target memory cell and the reference memory cell. The use of a differential instead of an absolute voltage allows for the use of a wider range of voltages than when using absolute voltages. The various embodiments described with respect to FIGS. 5-6 are amenable for use with the various memory devices and systems described above with respect to FIGS. 1-4.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method for expanding a usable threshold voltage range of a multi-level memory cell, comprising:
    sensing a threshold voltage difference between a target cell in a string of memory cells and a reference cell;
    wherein expanding further comprises using an absolute voltage window including a negative voltage as a differential window.

2. The method of claim 1, wherein the target cells and the reference cell are formed at substantially the same time.

3. The method of claim 1, wherein the target cells and the reference cell are formed using substantially the same process.

4. The method of claim 1, wherein the target cell is programmed to a voltage within one of at least two sub-ranges within at least a portion of a negative threshold voltage range, wherein each of the at least two sub-ranges correspond to different data states.

5. A memory device comprising:
    a first cell;
    a second cell; and
    a differential amplifier configured to determine a threshold voltage difference between the first cell and the second cell, wherein a negative voltage portion of a threshold voltage range of the first cell can correspond to a plurality of data states.

6. The memory device of claim 5, wherein the first cell and the second cell are formed at substantially the same time.

7. The memory device of claim 5, wherein the first cell and the second cell are formed using substantially the same process.

8. The memory device of claim 5, wherein the differential amplifier comprises a set of PMOS transistors.

9. The memory device of claim 5, wherein the first cell comprises a selected cell and the second cell comprises a reference cell.

10. The memory device of claim 5, wherein the first cell is one of a first string of cells.

11. The memory device of claim 10, wherein the second cell is one of a second string of cells.

12. The memory device of claim 11, wherein the first cell is in the same position within the first string as the second cell is within the second string.

13. The memory device of claim 5, wherein the second cell is programmed to a known voltage.

14. The memory device of claim 5, wherein the first cell varies with temperature in the same way as the second cell varies with temperature.

15. The memory device of claim 5, wherein the first cell and the second cell are substantially similar in construction.

16. The memory device of claim 5, wherein the first cell is programmed to a voltage within one of at least two sub-ranges within the negative voltage portion, wherein each of the at least two sub-ranges correspond to different data states.

17. A memory device comprising:
    a first cell;
    a second cell; and
    a differential amplifier configured to determine a threshold voltage difference between the first cell and the second cell, wherein a gate of the second cell is coupled to an output of the differential amplifier.

18. A differential amplifier, comprising:
a target cell;
a reference cell;
a current mirror load; and
a bias current source;
wherein the differential amplifier is configured to determine a difference between the first cell and the second cell.

19. The memory device of claim 18, wherein a negative voltage portion of a threshold voltage range of the target cell can correspond to a plurality of data states.

20. The memory device of claim 18, wherein the target cell and the reference cell are formed at substantially the same time.

21. The memory device of claim 18, wherein the target cell and the reference cell are formed using substantially the same process.

22. The memory device of claim 18, wherein the differential amplifier comprises a set of PMOS transistors.

23. The memory device of claim 18, wherein the target cell comprises a selected cell.

24. The memory device of claim 18, wherein the target cell is one of a first string of cells.

25. The memory device of claim 24, wherein the reference cell is one of a second string of cells.

26. The memory device of claim 25, wherein the target cell is in the same position within the first string as the reference cell is within the second string.

27. The memory device of claim 18, wherein the reference cell is programmed to a known voltage.

28. The memory device of claim 18, wherein the target cell varies with temperature in the same way as the reference cell varies with temperature.

29. The memory device of claim 18, wherein the target cell and the reference cell are substantially similar in construction.

30. The memory device of claim 18, wherein the target cell is programmed to a voltage within one of at least two sub-ranges within at least a portion of a negative threshold voltage range, wherein each of the at least two sub-ranges correspond to different data states.

31. The memory device of claim 18, wherein a gate of the reference cell is coupled to an output of the differential amplifier.

* * * * *